(12) United States Patent
Nishiwaki

(10) Patent No.: US 10,777,445 B2
(45) Date of Patent: Sep. 15, 2020

(54) SUBSTRATE PROCESSING APPARATUS AND SUBSTRATE TRANSFER METHOD

(71) Applicant: ASM IP Holding B.V., Almere (NL)

(72) Inventor: Kazuhiro Nishiwaki, Tama (JP)

(73) Assignee: ASM IP Holding B.V., Almere (NL)

( * ) Notice: Subject to any disclaimer, the term of this patent is extended or adjusted under 35 U.S.C. 154(b) by 15 days.

(21) Appl. No.: 16/212,555

(22) Filed: Dec. 6, 2018

(65) Prior Publication Data

US 2020/0185257 A1 Jun. 11, 2020

(51) Int. Cl.
| | | |
|---|---|---|
| *H01L 21/687* | (2006.01) | |
| *H01L 21/67* | (2006.01) | |
| *H01L 21/677* | (2006.01) | |
| *H01L 21/68* | (2006.01) | |

(52) U.S. Cl.
CPC .. *H01L 21/68742* (2013.01); *H01L 21/67259* (2013.01); *H01L 21/67742* (2013.01); *H01L 21/68* (2013.01); *H01L 21/68764* (2013.01); *H01L 21/68792* (2013.01)

(58) Field of Classification Search
CPC .................................................. H01L 21/68742
See application file for complete search history.

(56) References Cited

U.S. PATENT DOCUMENTS

| | | | |
|---|---|---|---|
| 2008/0124200 A1* | 5/2008 | Lee | H01L 21/67259 414/217.1 |
| 2010/0013626 A1 | 1/2010 | Park et al. | |
| 2011/0132873 A1* | 6/2011 | Tsujimoto | G01B 21/16 216/59 |
| 2018/0330942 A1* | 11/2018 | Taylor | H01L 21/02057 |

* cited by examiner

*Primary Examiner* — Saul Rodriguez
*Assistant Examiner* — Willie Berry, Jr.
(74) *Attorney, Agent, or Firm* — Studebaker & Brackett PC

(57) ABSTRACT

Examples of a substrate processing apparatus includes a susceptor, a plurality of three or more susceptor pins configured to protrude from an upper surface of the susceptor or be positioned below the upper surface of the susceptor, a transfer arm configured to provide a substrate onto the susceptor or take out a substrate on the susceptor, a plurality of sensors configured to individually detect contact or non-contact of a substrate with the plurality of susceptor pins individually, and a control device configured to monitor a detection result of the plurality of sensors and determine abnormality when an order of variations in a contact state of the substrate with the plurality of susceptor pins is not a predetermined order or when a time difference between the variations in the contact state of the substrate with the plurality of susceptor pins is not within a predetermined time difference range.

11 Claims, 11 Drawing Sheets

SUBSTRATE PROCESSING APPARATUS AND SUBSTRATE TRANSFER METHOD

TECHNICAL FIELD

Examples are described which relate to a substrate processing apparatus and a substrate transfer method.

BACKGROUND

A current Quad Chamber Module apparatus (QCM) is provided with four chambers arranged in two longitudinal columns and two lateral lines. Each chamber includes one susceptor and a plurality of susceptor pins. Processing such as film formation, film modification, etching, or the like is performed on one substrate in each chamber, for example. A substrate is transferred from a certain chamber of the QCM to another chamber by a transfer arm. According to an example, a substrate is rotated by the transfer arm to move the substrate from a certain chamber to another chamber. Such a substrate transfer system functions as a wafer rotation system.

Misalignment of substrates may occur due to the transfer of the substrates by the transfer arm, substrates may crack due to execution of processing on the substrates, or misalignment of substrates may occur due to execution of processing on the substrates. Detecting the foregoing troubles and taking necessary countermeasures thereto contribute to prevention of substrate transfer error and prevention of failure of the substrate processing apparatus.

SUMMARY

Some examples described herein may address the above-described problems. Some examples described herein may provide a substrate processing apparatus and a substrate transfer method that are capable of detecting troubles such as misalignment of substrates or cracking of substrates in a substrate transfer using a susceptor pin.

In some examples, a substrate processing apparatus includes a susceptor, a plurality of three or more susceptor pins configured to protrude from an upper surface of the susceptor or be positioned below the upper surface of the susceptor according to a height of the susceptor, a transfer arm configured to provide a substrate onto the susceptor or take out a substrate on the susceptor, a plurality of sensors configured to individually detect contact or non-contact of a substrate with the plurality of susceptor pins individually, and a control device configured to monitor a detection result of the plurality of sensors and determine abnormality when an order of variations in a contact state of the substrate with the plurality of susceptor pins is not a predetermined order or when a time difference between the variations in the contact state of the substrate with the plurality of susceptor pins is not within a predetermined time difference range.

DETAILED DESCRIPTION

A substrate processing apparatus and a substrate transfer method will be described with reference to the drawings. The same or corresponding components are represented by the same reference signs, and repetitive description thereof may be omitted.

Figure 1:
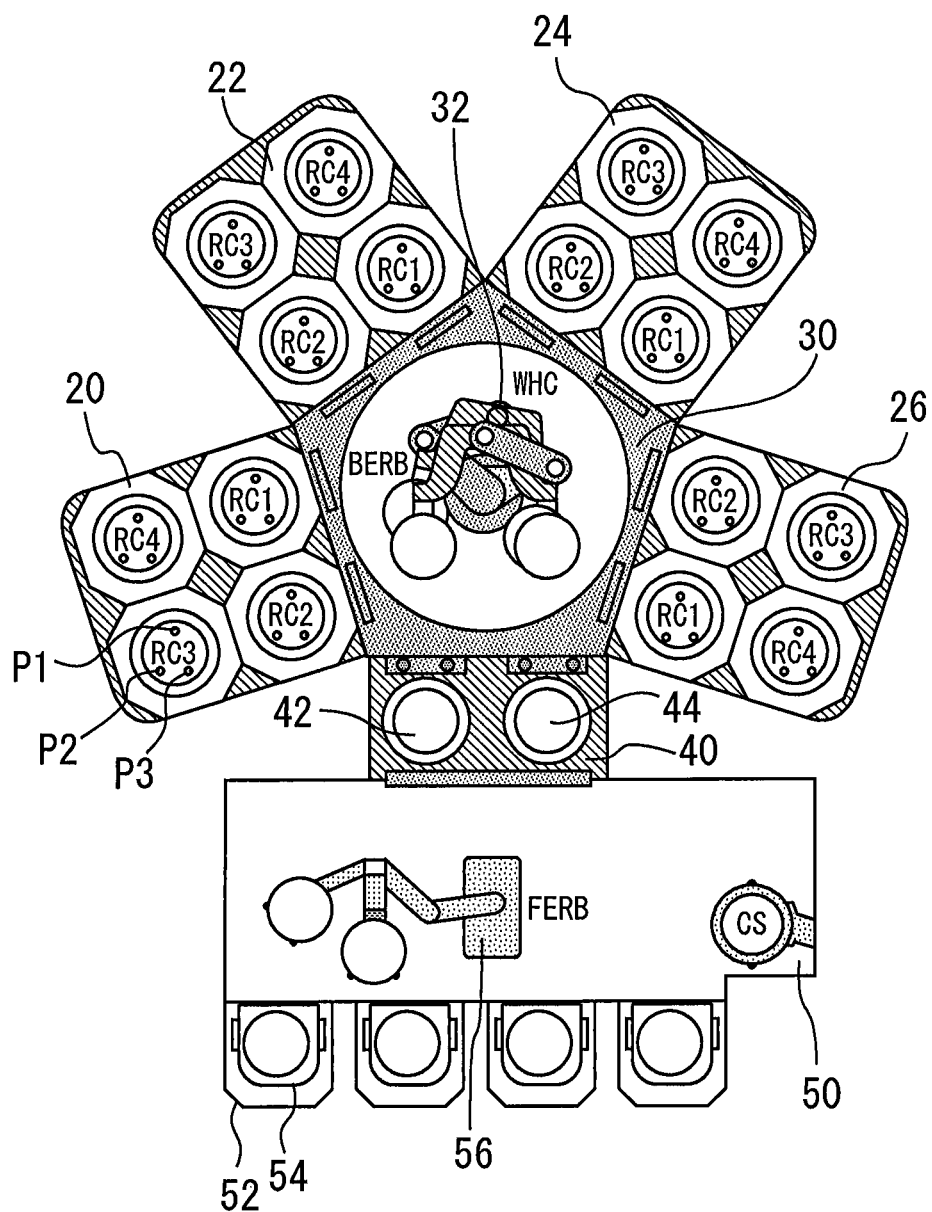
FIG. 1 illustrates an example of a substrate processing apparatus.

FIG. 1 illustrates an example of a configuration of a substrate processing apparatus. Four QCMs 20, 22, 24, 26 are modules configured to process a substrate. Each module includes four reactor chambers. The four reactor chambers are denoted as RC1, RC2, RC3, RC4. In the reactor chambers, for example, a plasma treatment is applied to a substrate. One reactor chamber includes one susceptor. According to an example, three susceptor pins can be raised and lowered for one susceptor. The susceptor pins projecting from the susceptor receive a substrate, and when the susceptor is raised, causing the susceptor pins to be retracted into the susceptor, the substrate rests on the susceptor. The reactor chambers are an example of a processing chamber where a substrate is processed.

The four QCMs 20, 22, 24, 26 connect to a wafer handling chamber 30. Gate valves may be provided at a boundary between the four QCMs 20, 22, 24, 26 and the wafer handling chamber 30 so that the QCMs 20, 22, 24, 26 can be coupled to and decoupled from the wafer handling chamber 30. A back end robot 32 is provided in the wafer handling chamber 30. The back end robot 32 is, for example, a multi joint robot. The back end robot 32 holds a substrate to be transported by securely sucking it through electrostatic or vacuum force. The back end robot 32 is, for example, an end effector.

A load lock chamber 40 is connected to the wafer handling chamber 30 via, for example, a gate valve. For example, two stages 42, 44 can be provided in the load lock chamber 40 for a substrate to rest on them. The back end robot 32 transports a substrate between the stage 42 or the stage 44 and any one of the susceptors.

An EFEM 50 is connected to the load lock chamber 40. The EFEM 50 includes load ports 52. The load ports 52 are provided so that a hoop 54 installing a wafer or configured to install a wafer can rest on them. A robot hand 56 provided in the EFEM 50 plays a role of transporting a substrate between the hoop 54 and the stages 42, 44.

Figure 2:
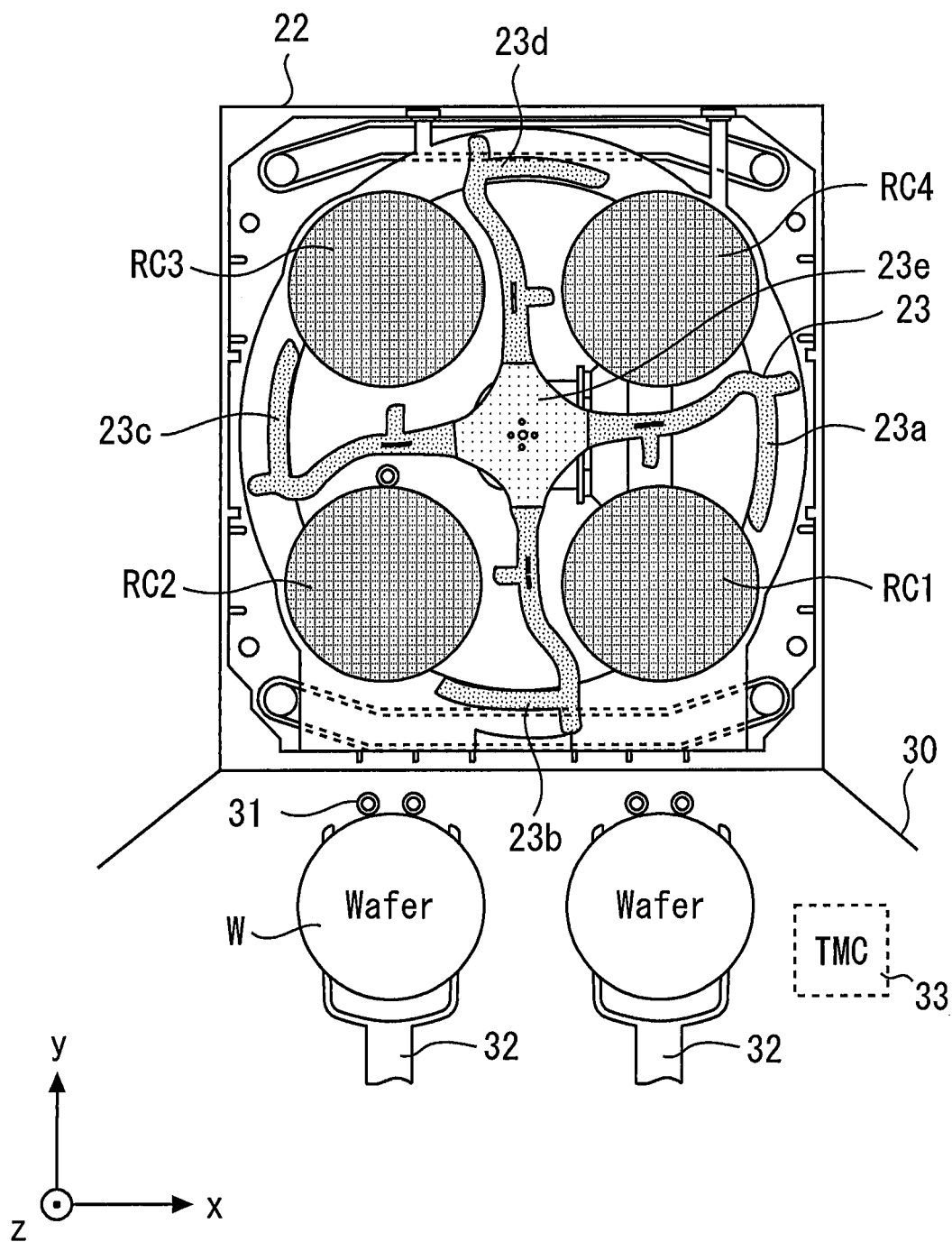
FIG. 2 illustrates an example of a QCM and a wafer handling chamber.

FIG. 2 is a plan view showing an example of the configuration of QCM 22 and a wafer handling chamber 30. The QCM 22 has a first reactor chamber RC1, a second reactor chamber RC2, a third reactor chamber RC3, and a fourth reactor chamber RC4. The wafer handling chamber 30 is located at a position closer to the first reactor chamber RC1 and the second reactor chamber RC2 than the third reactor chamber RC3 and the fourth reactor chamber RC4. The wafer handling chamber 30 intercommunicates directly or via a gate valve with the first reactor chamber RC1 and the second reactor chamber RC2.

A transfer arm 23 is provided inside the QCM 22. The transfer arm 23 includes, for example, a first arm 23a, a second arm 23b, a third arm 23c, a fourth arm 23d, and a shaft 23e. The first arm 23a, the second arm 23b, the third arm 23c, and the fourth arm 23d are supported by the shaft 23e, and rotated by rotation of the shaft 23e. The first to fourth arms 23a, 23b, 23c, and 23d are located between the reactor chambers or inside a specific reactor chamber according to the rotational state of the shaft 23e. The transfer arm 23 is used to provide a substrate onto a susceptor and take out a substrate on the susceptor. The transfer arm 23 can serve as a rotation arm for moving a substrate in one of the first to fourth reactor chambers RC1, RC2, RC3, and RC4 into another chamber. Such a rotation arm rotates, for example, counterclockwise by 180° in one operation. The QCMs 20, 24, and 26 may be configured to have the same configuration as the QCM 22.

FIG. 2 shows a back-end robot 32 which is provided inside the wafer handling chamber 30 and transfers a substrate. A sensor 31 is provided in a boundary region between the wafer handling chamber 30 and the QCM 22. For example, two sensors 31 are provided in front of the first reactor chamber RC1, and two sensors 31 are provided in front of the second reactor chamber RC2. One sensor 31 may include a light emitting element and a light receiving element that overlap each other in a z-direction. That is, the light emitting element emits laser light in a Z positive or negative direction, and the light receiving element receives the laser light. The presence or absence of a substrate between the light emitting element and the light receiving element is detected based on reception or non-reception of the laser light by the light receiving element. For example, the light receiving element outputs a high-level signal when it receives laser light, and outputs a low-level signal when it receives no laser light, whereby the light receiving element gives a waveform corresponding to the passage condition of a substrate.

The substrate processing apparatus may includes an automatic wafer sensing unit for determining whether a substrate has passed a predetermined position when the substrate is transferred from the wafer handling chamber 30 to the first reactor chamber RC1 or the second reactor chamber RC2 by the back-end robot 32. The automatic wafer sensing unit includes, for example, the aforementioned sensor 31 and a transfer module controller (TMC) 33 connected to the sensor 31. The TMC 33 is located, for example, under the wafer handling chamber 30. The TMC 33 compares a detection result of the sensor 31 with a predetermined waveform to determine whether the substrate has passed the predetermined position. In this way, it is possible to perform detection of abnormal transfer by the automatic wafer sensing unit when a substrate is transferred in a direction from the wafer handling chamber 30 to the first reactor chamber RC1 or the second reactor chamber RC2 or when a substrate is transferred in the opposite direction to the above direction. The abnormal transfer may be caused by misalignment of the substrate with respect to the back-end robot 32, cracking of the substrate, or the like. According to an example, it is possible for the TMC 33 to realize a correction function for correcting a transfer destination when abnormal transfer is detected. Such an automatic wafer sensing unit can be applied to not only the QCM 22, but also the QCMs 20, 24, and 26.

Figure 3:
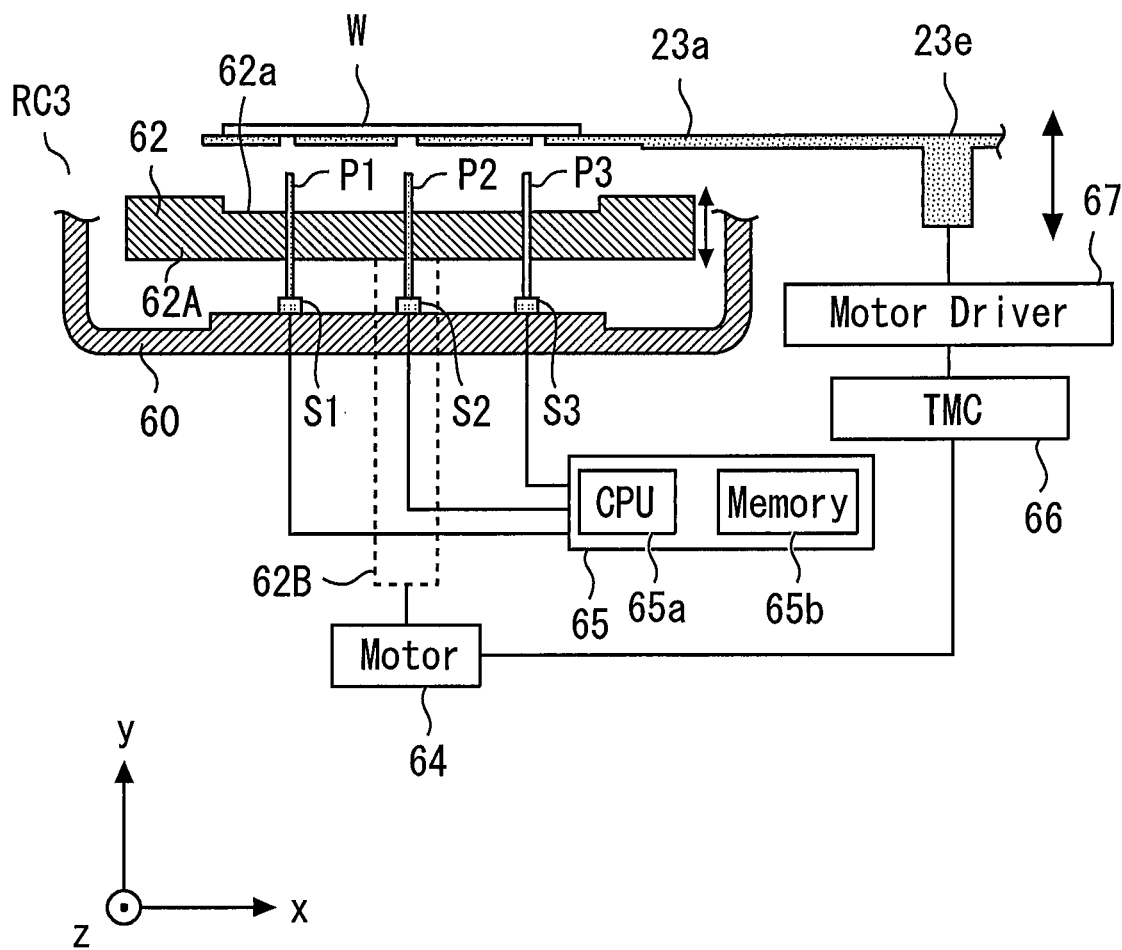
FIG. 3 is a cross-sectional view showing an example of the configuration of one reactor chamber.

FIG. 3 is a cross-sectional view showing an example of the configuration of one reactor chamber. As an example, the configuration of the third reactor chamber RC3 will be described, but the other reactor chambers may have the same configuration. A susceptor 62 is provided to place a substrate W as a processing target. The susceptor 62 includes a substrate supporter 62A, and a shaft portion 62B. A wafer pocket 62a may be formed in the substrate supporter 62A. The shaft portion 62B receives the force of a motor 64 under the control of the TMC 66, and can move upward or downward in a vertical direction, that is, in z positive and negative directions. The upward and downward movement of the shaft portion 62B also makes the substrate supporter 62A to move upward and downward. According to an example, susceptor pins P1, P2, and P3 are fixed to the chamber 60 via sensors S1, S2, and S3. The sensors S1, S2, and S3 may be provided at different positions for detecting the contact or non-contact of the substrate with the susceptor pins P1, P2, and P3. The susceptor pins P1, P2, and P3 are configured to protrude from the upper surface of the susceptor 62 or be positioned below the upper surface of the susceptor 62 according to the height of the susceptor 62. FIG. 3 shows a state where the susceptor pins P1, P2, and P3 protrude from the upper surface of the susceptor 62. The number of susceptor pins to be provided to one susceptor 62 may be three or more.

The plurality of sensors S1, S2, and S3 individually detect the contact or non-contact of the substrate W with the plurality of susceptor pins P1, P2, and P3, respectively. Such sensors S1, S2, and S3 are, for example, pressure-sensitive sensors. The sensors S1, S2, and S3 detect the contact or non-contact of the substrate with the susceptor pins P1, P2, and P3 respectively, and thus it may be omitted for the sensors S1, S2, and S3 to detect the weight of the substrate placed on the susceptor pins P1, P2, and P3. The contact state between the substrate W and the susceptor pins P1, P2, and P3 is detected by the sensors S1, S2, and S3. When the substrate W is in contact with the susceptor pins P1, P2, and P3, the pressure is detected, and otherwise, no pressure is detected. A detection result is acquired by a computer 65. The computer 65 includes, for example, CPU 65a and a memory 65b.

The configurations of the susceptor 62, the plurality of susceptor pins P1, P2, and P3, etc., shown in FIG. 3 may be provided in the first reactor chamber RC1, the second reactor chamber RC2, the third reactor chamber RC3, and the fourth reactor chamber RC4. According to an example, the sensors S1, S2, and S3 and the computer 65 for receiving the detection results from these sensors may be provided in the third reactor chamber RC3 and the fourth reactor chamber RC4, but may not be provided in the first reactor chamber RC1 and the second reactor chamber RC2.

Figure 4:
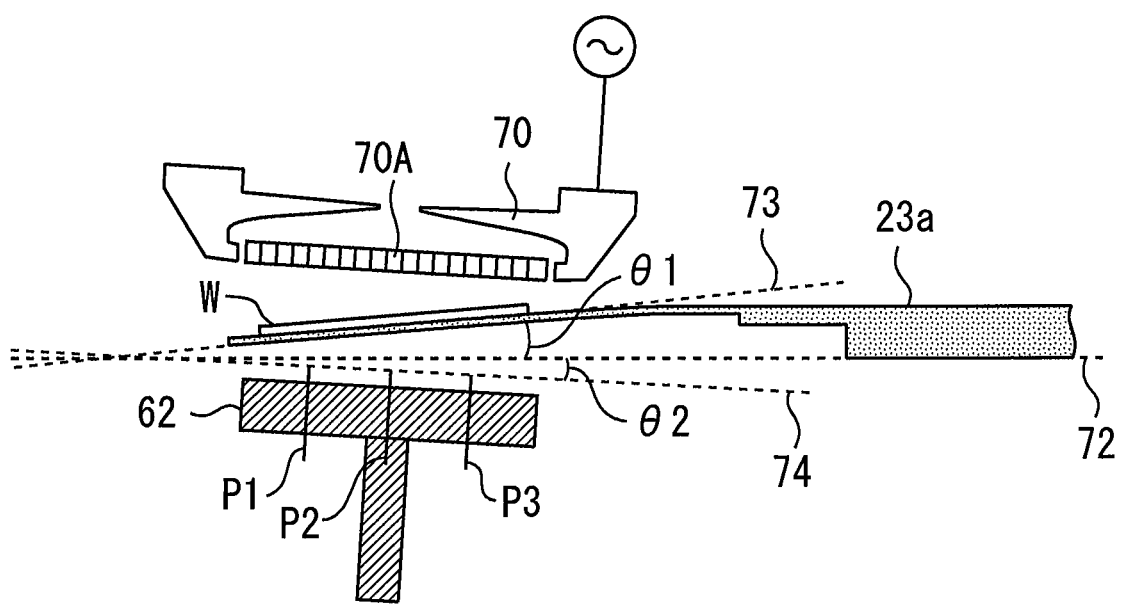
FIG. 4 is a cross-sectional view showing an example of the configuration of one reactor chamber.

FIG. 4 is a cross-sectional view showing an example of the configuration of one reactor chamber. A shower head 70 is provided above the susceptor 62, and has an opening 70A therein. High frequency power is applied to the shower head 70, and the shower head 70 is made of, for example, metal. High frequency power is applied to the shower head 70 while gas is provided onto the susceptor 62 through the opening 70A, whereby the substrate can be subjected to plasma processing. The susceptor 62 may be inclined with respect to a horizontal line 72. A cause of the inclination is, for example, a change in the inclination of the susceptor 62 to make the susceptor 62 and the shower head 70 parallel to each other, a unique inclination of the susceptor 62, or the like. FIG. 4 shows a susceptor parallel line 74 parallel to the susceptor 62. The intersection angle between the susceptor parallel line 74 and the horizontal line 72 is equal to θ2°.

The first arm 23a sags because it supports the substrate W. An arm parallel line 73 parallel to the sagging first arm 23a is shown in FIG. 4. The intersection angle between the arm parallel line 73 and the horizontal line 72 is equal to θ1°. One or both of the inclination of the susceptor 62 with respect to the horizontal line 72 and the inclination of the arm with respect to the horizontal line cause a unique distance between each of the susceptor pins P1, P2, and P3 and the substrate W placed on the transfer arm. These unique distances cause an order in which the substrate W comes into contact with and separates from the plurality of susceptor pins P1, P2, and P3.

Figure 5:
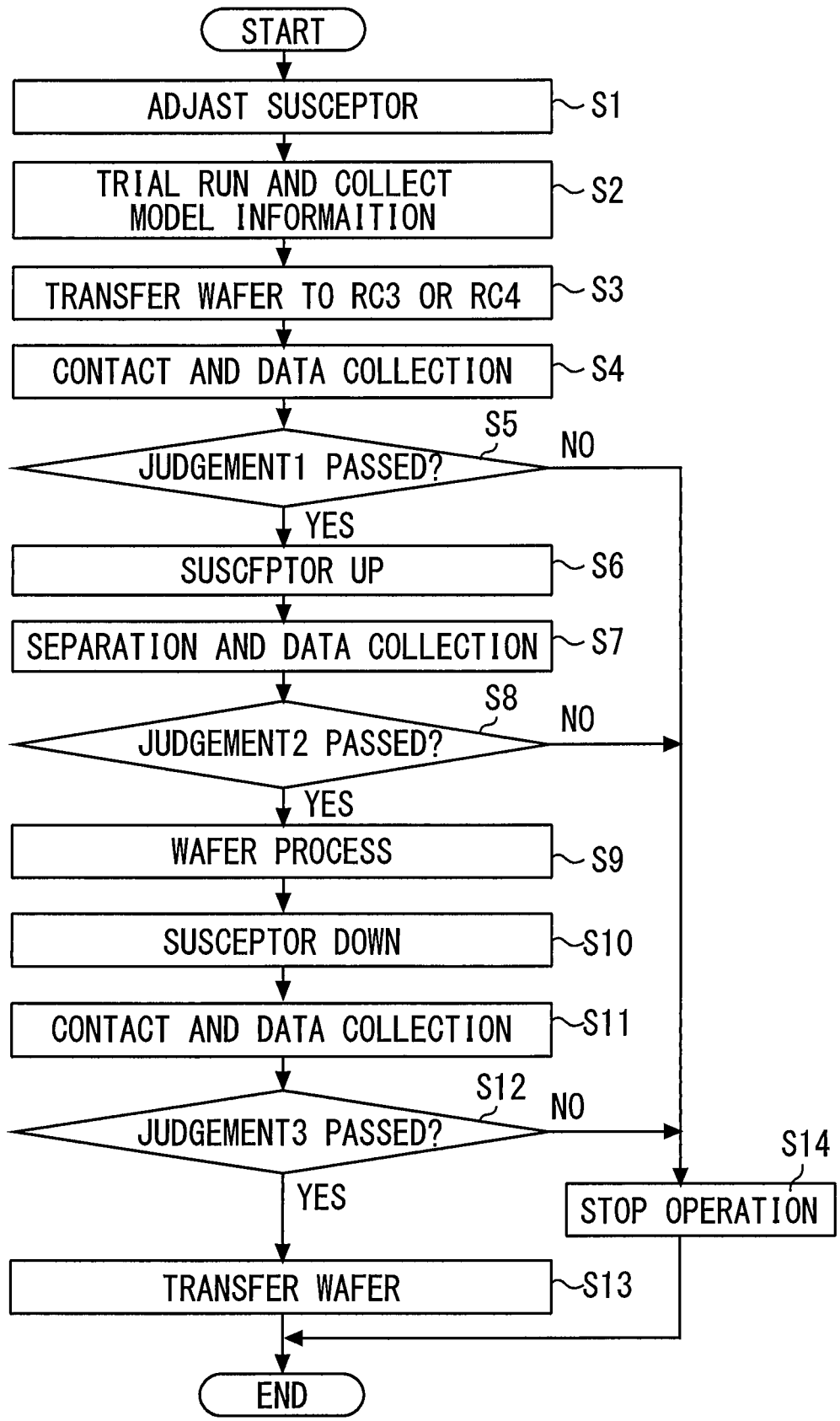
FIG. 5 is a flowchart.

FIG. 5 is a flowchart showing an example of a substrate transfer method using a substrate processing apparatus. First, the inclination of the susceptor 62 is adjusted in step S1. This adjustment is performed on all of four susceptors included in the QCM. The purpose of this adjustment is, for example, to make each susceptor and the shower head parallel to each other.

Then, the processing proceeds to step S2. In step S2, an order in variation in the contact state between the plurality of susceptor pins and the substrate and a time difference in variation in the contact state between the plurality of susceptor pins and the substrate in a normal substrate transfer are defined as a model pattern. According to an example, model patterns for the following three situations may be defined. A first situation is a transfer-arm-down situation where the transfer arm 23 supporting the substrate W is moved downward to bring the substrate W into contact with the plurality of susceptor pins P1, P2, and P3, a second situation is a susceptor-up situation where the susceptor 62 is moved upward to separate the substrate W from the susceptor pins P1, P2, and P3 while the substrate W is supported by the susceptor pins P1, P2, and P3, and a third situation is a susceptor-down situation where the susceptor is moved downward to bring the substrate W into contact with the susceptor pins P1, P2, and P3 while the substrate is supported by the susceptor. According to another example, model patterns for other situations may be defined.

The model pattern for the transfer-arm-down situation may contain an order in which the substrate W comes into contact with each of the susceptor pins P1, P2, and P3, and each time difference between these contacts. The model pattern for the susceptor-up situation may contain an order in which the substrate W separates from each of the susceptor pins P1, P2, and P3, and each time difference between these separations. The model pattern for the susceptor-down situation may contain an order in which the substrate W comes into contact with each of the susceptor pins P1, P2, and P3, and each time difference between these contacts. The definition and storage of these model patterns are performed by the sensors S1, S2, S3, and the computer 65.

Figure 6:
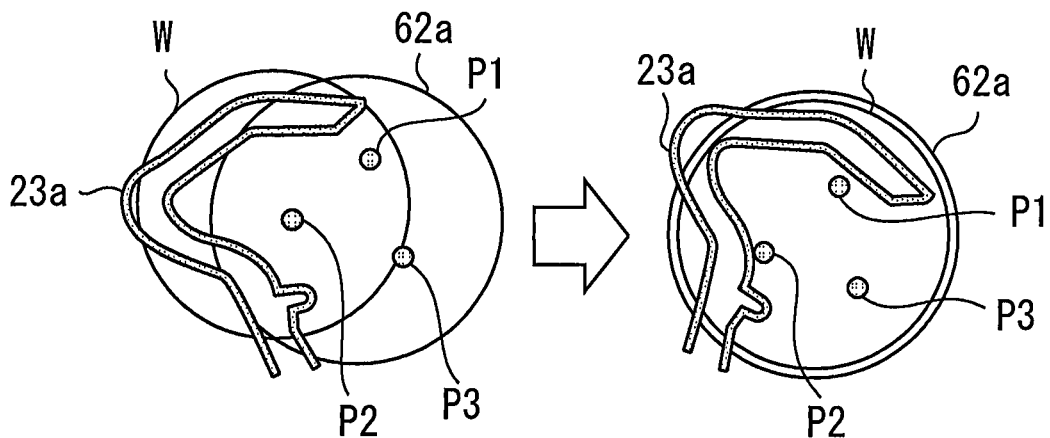
FIG. 6 is a plan view showing an example of the transfer arm.

Then, the processing proceeds to step S3. In step S3, the substrate W is supplied to the third reactor chamber RC3 or the fourth reactor chamber RC4 by using the transfer arm 23. For example, the substrate supported by the transfer arm 23 in the first reactor chamber RC1 and the second reactor chamber RC2 is moved to the third reactor chamber RC3 and the fourth reactor chamber RC4 by rotating the transfer arm 23 by 180°. FIG. 6 is a plan view showing an example of the transfer of a substrate by the transfer arm 23. It is shown on the left side of FIG. 6 that the first arm 23a being rotated is supporting the substrate W. It is shown on the right side of FIG. 6 that the first arm 23a has stopped in a state where the substrate W is positioned just above a wafer pocket 62a. Centrifugal force is applied to the substrate W by the rotation of the transfer arm 23, and the substrate W may slightly slides on the transfer arm 23. In this way, in step S3, the substrate W supported by the transfer arm 23 is placed above the susceptor 62.

Figure 7:
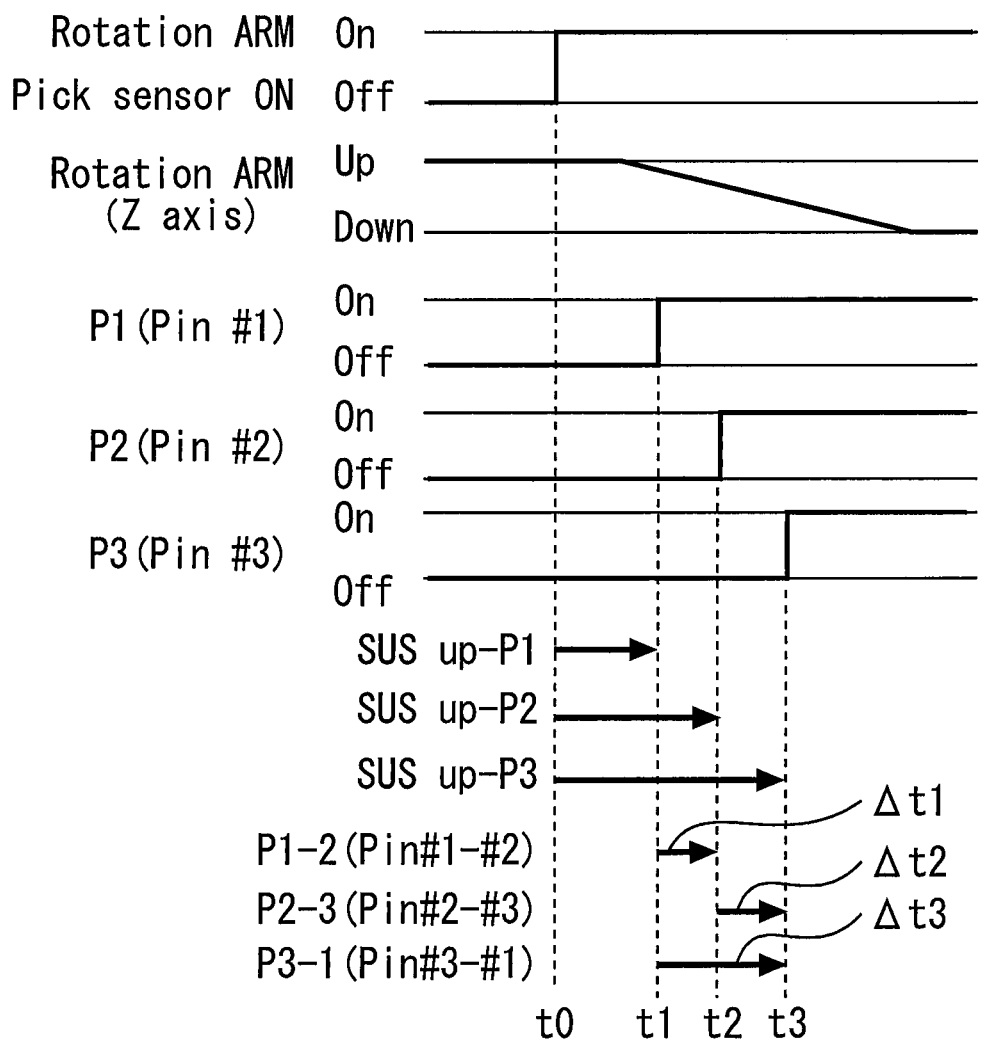
FIG. 7 is a waveform diagram.
Figure 8:
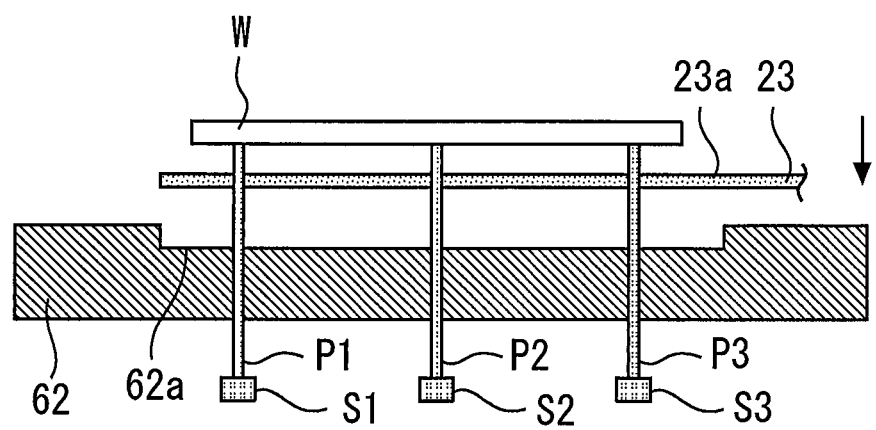
FIG. 8 shows that the transfer arm moves downward.

Then, the processing proceeds to step S4. In step S4, the transfer arm 23 is moved downward while the substrate W supported by the transfer arm 23 is normally located just above the wafer pocket 62a. FIG. 7 is a waveform diagram showing an operation in the transfer-arm-down situation. In FIG. 7, a timing at which an item of "Rotation ARM Pick Sensor ON" changes from Off to On is a timing at which the transfer arm 23 has reached a position shown on the right side of FIG. 6. The transfer arm 23 moves downward, and the substrate W comes into contact with the susceptor pins P1, P2, and P3 during the transition of the transfer arm 23 from an up-state where the transfer arm 23 is located at a high position to a down-state where the transfer arm 23 is located at a low position. With respect to the items P1, P2, and P3 in FIG. 7, the time when the signal level changes from Off to On is the time when the contact of the substrate W with the susceptor pins P1, P2, and P3 is detected by the sensors S1, S2, and S3, respectively. An order in which the substrate comes into contact with the susceptor pins occurs according to the inclination of the susceptor or the sag of the arm. In the example of FIG. 7, the substrate W comes into contact with the susceptor pin P1 at a time t1, then the substrate W comes into contact with the susceptor pin P2 at a time t2, and finally, the substrate W comes into contact with the susceptor pin P3 at a time t3. FIG. 8 shows that the transfer arm 23 moves downward and all the susceptor pins P1, P2, and P3 have been in contact with the substrate W.

In the example of FIG. 7, first, variation in the contact state between the susceptor pin P1 and the substrate W occurs, then variation in the contact state between the susceptor pin P2 and the substrate W occurs, and finally variation in the contact state between the susceptor pin P3 and the substrate W occurs. Furthermore, the time difference between the variations in the contact state of the susceptor pin P1 and the susceptor pin P2 is equal to Δt1, the time difference between the variations in the contact state of the susceptor pin P2 and the susceptor pin P3 is equal to Δt2, and the time difference between the variations in the contact state of the susceptor pin P1 and the susceptor pin P3 is equal to Δt3. These data are calculated by the computer 65 receiving detection results of the sensors S1, S2, and S3.

Next, in step S5, the computer 65 compares the foregoing calculated data with the model pattern defined in step S2. If the contact order in the detection result shown in FIG. 7 is coincident with the contact order of the model pattern, and the time differences Δt1, Δt2, and Δt3 shown in FIG. 7 are within a time difference range of the model pattern, it is determined that the transfer is normal, and the processing proceeds to step S6. If not so, it is determined that the transfer is abnormal, and the processing proceeds to step S14. The data of the time differences of the model pattern may not be set to specific values, and may be defined by upper and lower limit values.

Figure 9:
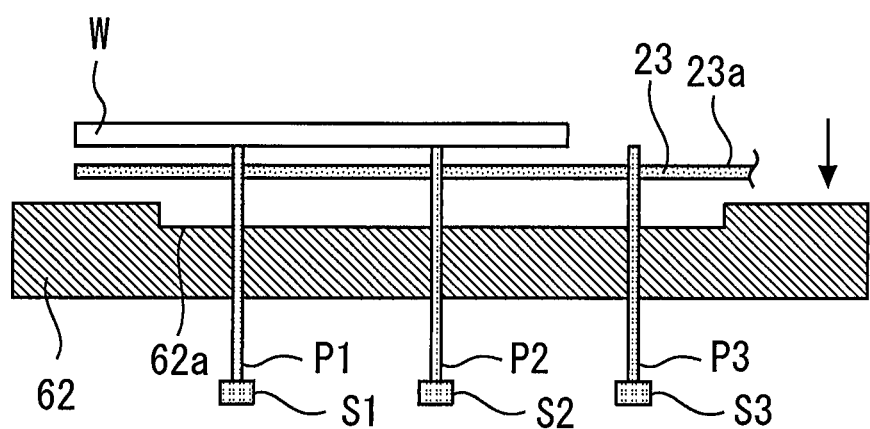
FIG. 9 shows an example of occurrence of abnormality.

FIG. 9 shows an example of occurrence of abnormality determination. When the transfer arm 23 is moved downward in a state where the substrate W deviates from just above the wafer pocket 62a for some reason, for example, the substrate does not come into contact with the susceptor pin P3. In this case, the order of the variations in the contact state of the model case is not realized, and thus an abnormality determination is made. Not only the misalignment of the substrate, but also cracking of the substrate may cause an abnormality determination. If transfer abnormality is determined by the computer 65 in step S5, the computer 65 executes at least one of stopping the transfer arm 23, reporting to a user, and changing the transfer method using the transfer arm 23 in step S14.

Figure 10:
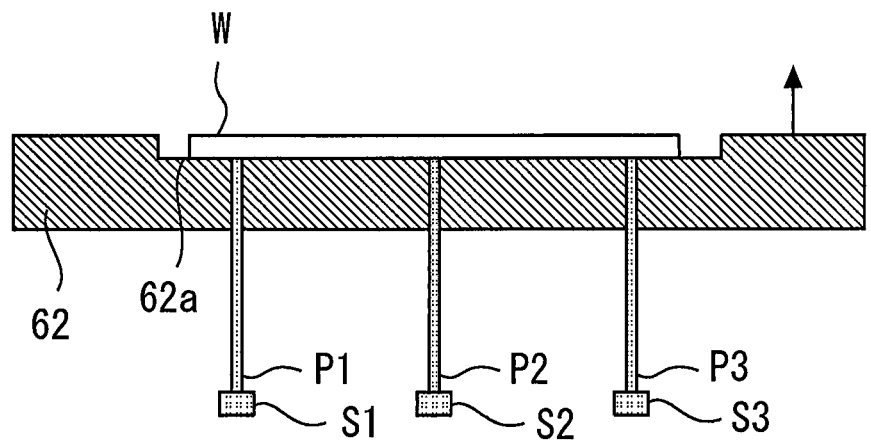
FIG. 10 shows upward movement of the susceptor.

On the other hand, if the computer 65 determines in step S5 that the normal transfer has been performed, the processing proceeds to step S6. In step S6, the susceptor 62 is moved upward to bring the susceptor 62 and the substrate W into contact with each other. FIG. 10 shows that the susceptor 62 and the substrate W brought into contact with each other by upward movement of the susceptor 62. When the substrate W comes into contact with the susceptor 62, the susceptor pins P1, P2, and P3 separate from the substrate W.

Figure 11:
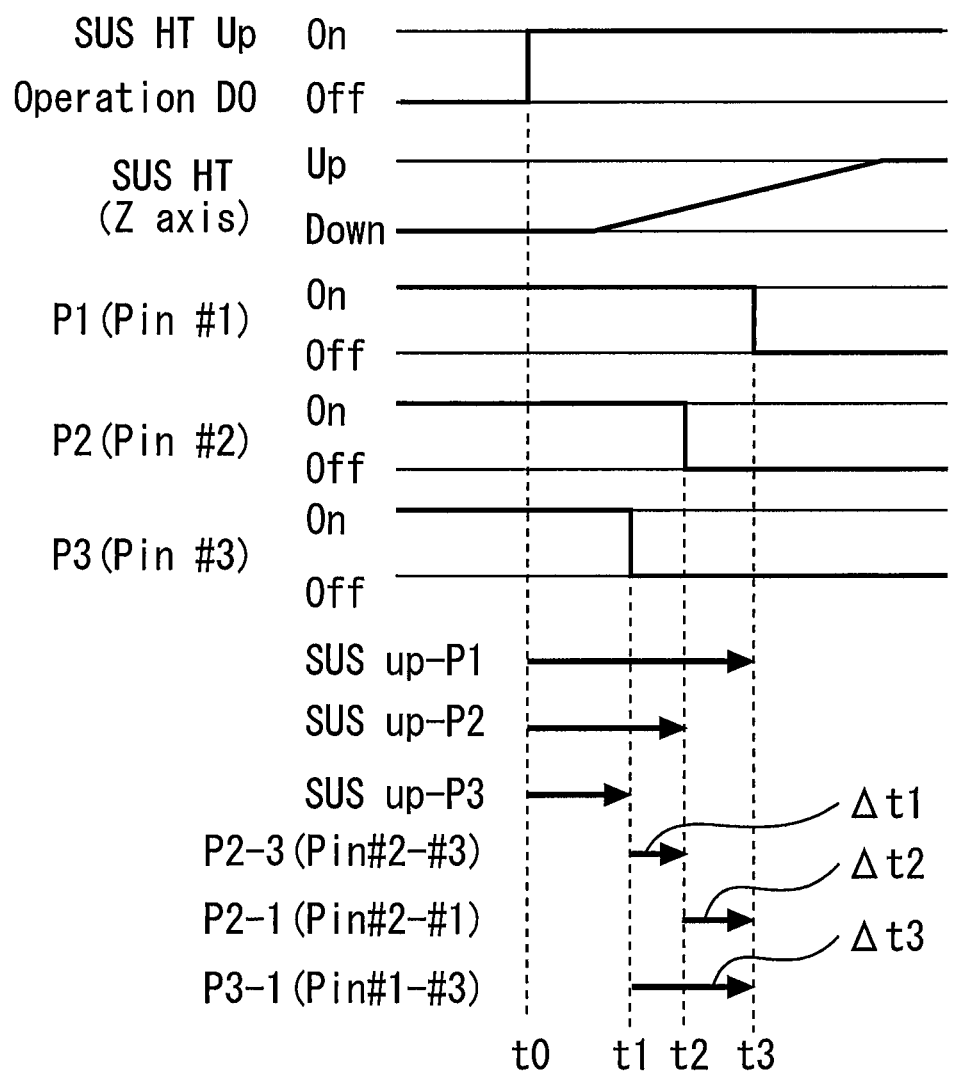
FIG. 11 is a waveform diagram.

FIG. 11 is a waveform diagram showing an operation in the susceptor-up situation. In step S7, for example, a waveform shown in FIG. 11 is acquired. In FIG. 11, when the item of "SUS HT Up Operation Do" changes from Off to On, the susceptor 62 is allowed to move upward. Then, as described in the item of "SUS HT", the susceptor moves upward from the lowest position indicated by Down to the highest position indicated by Up. During this upward movement of the susceptor 62, the susceptor pins P1, P2, and P3 separate from the substrate W. In the example of FIG. 11, the susceptor P3 and the substrate W separate from each other at the time t1, then the susceptor pin P2 and the substrate W separate from each other at the time t2, and finally the susceptor pin P1 and the substrate W separate from each other at the time t3.

In the example of FIG. 11, first, the variation in the contact state between the susceptor pin P3 and the substrate W occurs, then the variation in the contact state between the susceptor pin P2 and the substrate W occurs, and finally the variation in the contact state between the susceptor pin P1 and the substrate W occurs. Furthermore, the time difference between the variations in the contact state of the susceptor pin P1 and the susceptor pin P2 is equal to Δt2, the time difference between the variations in the contact state between the susceptor pin P2 and the susceptor pin P3 is equal to Δt1, and the time difference between the variations in the contact state between the susceptor pin P1 and the susceptor pin P3 is equal to Δt3. These data are calculated by the computer 65 receiving the detection results of the sensors S1, S2, and S3.

Next, in step S8, the foregoing calculated data is compared with the model pattern defined in step S2. If the contact order in the detection result shown in FIG. 11 is coincident with the contact order of the model pattern, and the time differences Δt1, Δt2, and Δt3 shown in FIG. 11 are within the time difference range of the model pattern, it is determined that the transfer is normal, and the processing proceeds to step S9. If not so, it is determined that the transfer is abnormal, and the processing proceeds to step S14. The data of the time differences of the model pattern may not be set to specific values, and may be defined by upper and lower limit values.

Figure 12:
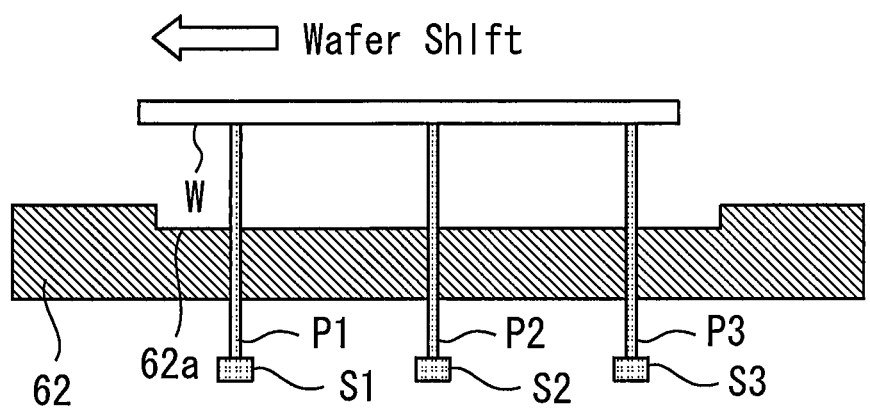
FIG. 12 shows a substrate deviates from just above the wafer pocket.
Figure 13:
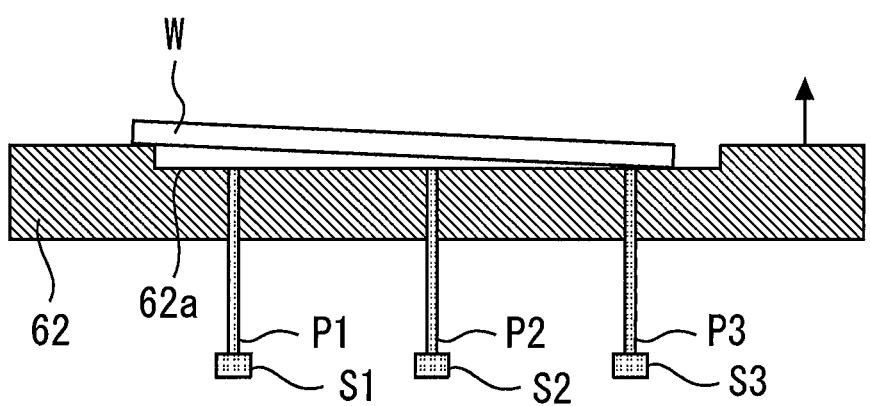
FIG. 13 shows a substrate deviates from just above the wafer pocket.

FIGS. 12 and 13 show examples of occurrence of abnormality determination. When the susceptor 62 is moved upward while the substrate deviates from just above the wafer pocket 62a for some reason as shown in FIG. 12, for example, the susceptor pin P3 and the substrate W do not separate from each other as shown in FIG. 13. In this case, the order of the variations in the contact state of the model case is not realized, and thus an abnormality determination is made. The processing in step S14 is as described above.

On the other hand, if the computer 65 determines in step S8 that the normal transfer has been carried out, the processing proceeds to step S9. In step S9, processing such as plasma processing is performed on the substrate W placed on the susceptor 62.

Figure 14:
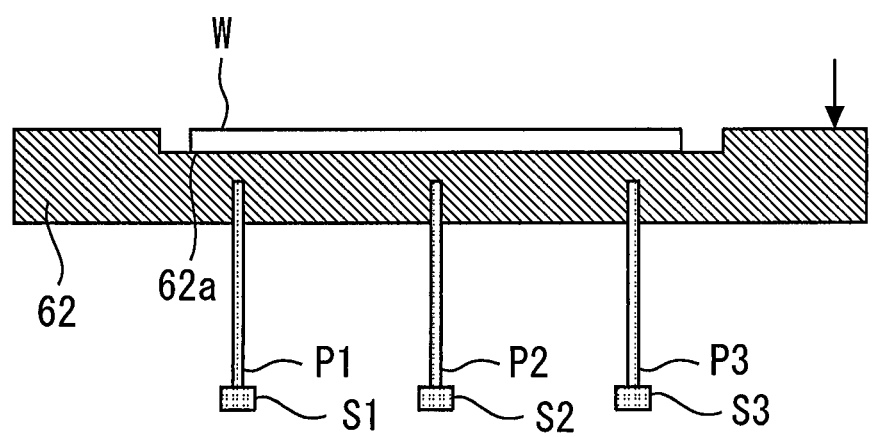
FIG. 14 shows that the susceptor is moved downward.
Figure 15:
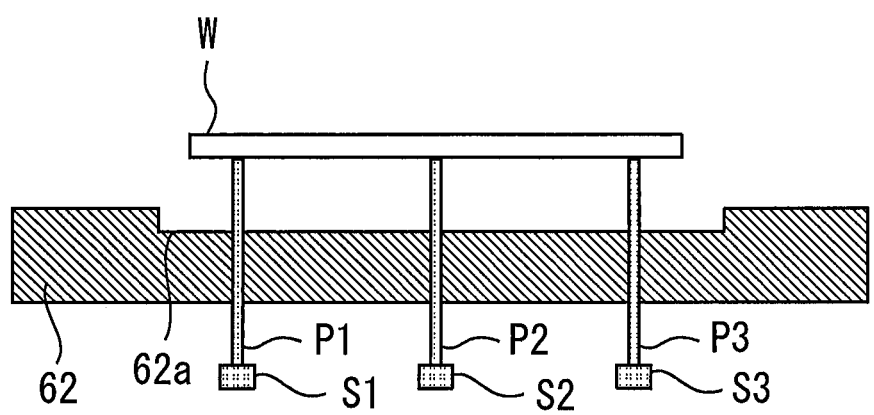
FIG. 15 shows that the susceptor is moved downward.
Figure 16:
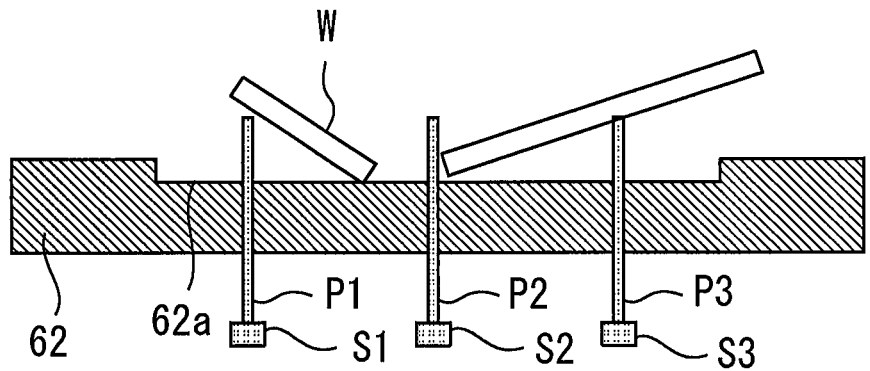
FIG. 16 is a waveform diagram.

Next, the processing proceeds to step S10. In step S10, the susceptor 62 is moved downward. FIGS. 14 and 15 show that the susceptor 62 is moved downward. When the susceptor 62 moves downward as shown in FIG. 14, the substrate W comes into contact with the susceptor pins P1, P2, and P3 as shown in FIG. 15. Data containing the order of the variations in the contact state of the susceptor pins with the substrate, and each time difference between the variations in the contact state of the substrate with the plurality of susceptor pins, which are associated with the downward movement of the susceptor 62, are collected and evaluated in step S11. FIG. 16 is a waveform diagram showing an operation in the susceptor-down situation.

In FIG. 16, when the item of "SUS HT Down Operation Do" changes from Off to On, the susceptor 62 is allowed to move downward. Then, as described in the item of "SUS HT", the susceptor 62 moves downward from the highest position indicated by UP to the lowest position indicated by Down. During this downward movement, the susceptor pins P1, P2, and P3 come into contact with the substrate W. In the example of FIG. 16, the susceptor pin P1 and the substrate W come into contact with each other at the time t1, then the susceptor pin P2 and the substrate W come into contact with each other at the time t2, and finally the susceptor pin P3 and the substrate W come into contact with each other at the time t3.

In the example of FIG. 16, first, the variation in the contact state between the susceptor pin P1 and the substrate W occurs, then the variation in the contact state between the susceptor pin P2 and the substrate W occurs, and finally the variation in the contact state between the susceptor pin P3 and the substrate W occurs. In addition, the time difference between the variations in the contact state of the susceptor pin P1 and the susceptor pin P2 is equal to Δt1, the time difference between the variations in the contact state of the susceptor pin P2 and the susceptor pin P3 is equal to Δt2, and the time difference between the variations in the contact state between the susceptor pin P1 and the susceptor pin P3 is equal to Δt3. These data are calculated by the computer 65 receiving the detection results of the sensors S1, S2, and S3.

Next, in step S12, the foregoing calculated data is compared with the model pattern defined in step S2. If the contact order in the detection result shown in FIG. 16 is coincident with the contact order of the model pattern, and the time differences Δt1, Δt2, and Δt3 shown in FIG. 16 are within a time difference range of the model pattern, it is determined that the transfer is normal, and the processing proceeds to step S13. If not so, it is determined that the transfer is abnormal, and the processing proceeds to step S14. The data of the time differences in the model pattern may not be set to specific values, and may be defined by upper and lower limit values.

Figure 17:
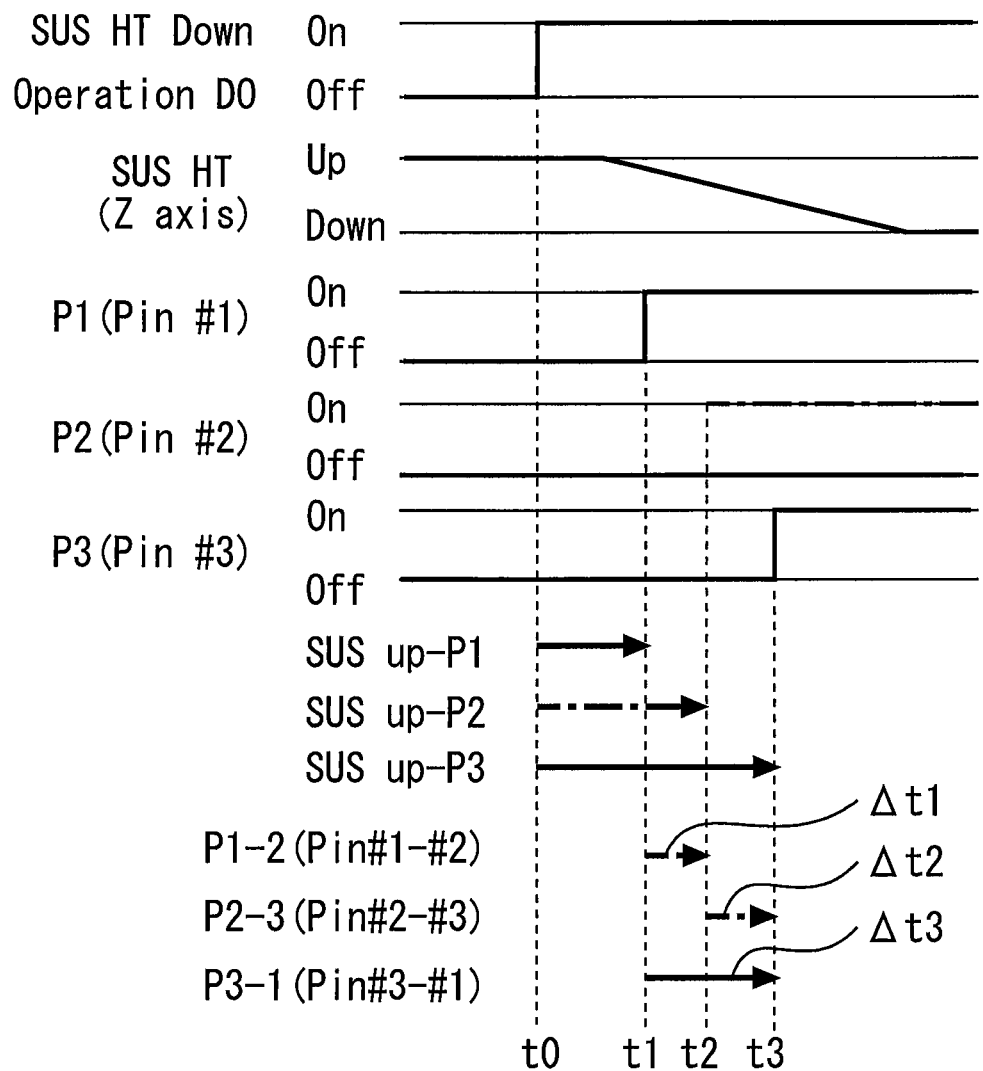
FIG. 17 shows an example of occurrence of abnormality.

FIG. 17 shows an example of occurrence of abnormality determination. FIG. 17 shows that the substrate W has cracked due to the substrate processing in step S9 as an example. In this case, when the susceptor 62 is moved downward, the susceptor pins P1 and P3 come into contact with the substrate W, but the susceptor pin P2 does not come into contact with the substrate. Therefore, the data indicated by a one-dotted chain line of FIG. 16 cannot be obtained. In this case, the order of the variations in the contact state of the model case is not realized, and an abnormality determination is made. The processing in step S14 is as described above.

On the other hand, if the computer determines in step S12 that the normal transfer has been performed, the processing proceeds to step S13. In step S13, the substrate W is supported by the transfer arm 23 by positioning the transfer arm 23 between the substrate W and the susceptor 62 and moving the transfer arm 23 upward. Then, the transfer arm 23 is rotated to perform predetermined transfer.

In this way, the series of processing of the flowchart of FIG. 5 is completed. Execution of the determination in steps S5, S8, and S12 is an example, and according to another example in which a substrate processing apparatus having a different configuration is adopted, it is possible to determine the presence or absence of transfer abnormality by a step different from these steps. That is, in all steps or an arbitrary step for bringing the plurality of susceptor pins and the substrate into contact with each other or separating them from each other, it is possible to "check" that the order of the variations in the contact state of the substrate with the plurality of susceptor pins is a predetermined order, and also that the time differences between the variations in the contact state of the substrate with the plurality of susceptor pins are within a predetermined time difference range. In the foregoing example, this "check" is executed in the following stages:

when the transfer arm 23 on which the substrate W is supported is brought close to the susceptor 62 to bring the plurality of susceptor pins P1, P2, and P3 into contact with the substrate W;

when the susceptor 62 is moved upward with respect to the plurality of susceptor pins P1, P2, and P3 while the substrate W is supported by the plurality of susceptor pins P1, P2, and P3 to bring the susceptor 62 into contact with the substrate W, whereby the plurality of susceptor pins P1, P2, and P3 are separated from the substrate W; and when the susceptor 62 is moved downward with respect to the plurality of susceptor pins P1, P2, and P3 while the substrate W is supported by the susceptor 62 to bring the plurality of susceptor pins P1, P2, and P3 into contact with the substrate W.

When the order of variations in the contact state is not a predetermined order or when the time differences between the variations in the contact state is not within a predetermined time difference range, the substrate processing apparatus may stop the transfer arm 23 and report to a user. In addition, it is also possible to change the transfer method using the transfer arm 23. This change may include reduction of the rotational speed of the transfer arm in order to suppress misalignment of the substrate with respect to the transfer arm, or increase of the inclination amounts of the first to fourth arms from the horizontal line in order to suppress the substrate from sliding on the transfer arm under the centrifugal force. Furthermore, it is possible to construct a database for associating aspects of abnormality with changes to alleviate such abnormalities and make an appropriate "change of the transfer method using the transfer arm 23" corresponding to the type of abnormality by using the database.

The computer 65 for determining whether the transfer of the substrate W is normal or abnormal may be an arbitrary control device having another configuration. The control device monitors the detection results of the plurality of sensors S1, S2, and S3, and determines that the transfer of the substrate W is abnormal when the order of the variations in the contact state of the substrate W with the plurality of susceptor pins P1, P2, and P3 is not a predetermined order, or when the time differences between the variations in the contact state of the substrate W with the plurality of susceptor pins P1, P2, and P3 are not within a predetermined time difference range. When abnormality is determined, the processing in step S14 of FIG. 5 is executed.

The plurality of sensors S1, S2, and S3 and the above-described control device may be provided to the third reactor chamber RC3 and the fourth reactor chamber RC4. With respect to the transfer of the substrate to the first reactor chamber RC1 and the second reactor chamber RC2 or carrying-out of the substrate from the first reactor chamber RC1 and the second reactor chamber RC2, abnormality can be detected by using the detection result of the above-described sensor 31.

The substrate transfer method described above can be used for detection of misalignment, cracking, or the like of a wafer which may occur due to a series of processing of providing the substrate to the susceptor and carrying out the substrate from the susceptor by using the transfer arm. Accordingly, the transfer arm is not limited to a rotation arm, and may be any type of transfer arm.

The invention claimed is:

1. A substrate processing apparatus comprising:
a susceptor;
a plurality of three or more susceptor pins configured to protrude from an upper surface of the susceptor or be positioned below the upper surface of the susceptor according to a height of the susceptor;
a transfer arm configured to provide a substrate onto the susceptor or take out a substrate on the susceptor;
a plurality of sensors configured to individually detect contact or non-contact of a substrate with the plurality of susceptor pins individually; and
a control device configured to
define a model pattern for a normal state of contact between the substrate and the plurality of susceptor pins, the model pattern including information about an order of variations in a contact state of the substrate with the plurality of susceptor pins and a time difference between the variations in the contact state of the substrate with the plurality of the susceptor pins,
monitor a detection result of the plurality of sensors, and
determine abnormality when the detected order of variations or the detected time difference is not coincident with the model pattern.

2. The substrate processing apparatus according to claim 1, wherein
when detecting the abnormality, the control device is configured to perform at least one of stopping the transfer arm, reporting to the user, and changing a transfer method using the transfer arm.

3. The substrate processing apparatus according to claim 1, wherein
the plurality of sensors are pressure-sensitive sensors.

4. The substrate processing apparatus according to claim 1, comprising
a shower head that is provided above the susceptor and has an opening therein and to which high frequency power is applied.

5. A substrate processing apparatus comprising:
a susceptor;
a plurality of three or more susceptor pins configured to protrude from an upper surface of the susceptor or be positioned below the upper surface of the susceptor according to a height of the susceptor;

a transfer arm configured to provide a substrate onto the susceptor or take out a substrate on the susceptor;

a plurality of sensors configured to individually detect contact or non-contact of a substrate with the plurality of susceptor pins individually;

a control device configured to monitor a detection result of the plurality of sensors and determine abnormality when an order of variations in a contact state of the substrate with the plurality of susceptor pins is not a predetermined order or when a time difference between the variations in the contact state of the substrate with the plurality of susceptor pins is not within a predetermined time difference range;

a QCM having a first reactor chamber, a second reactor chamber, a third reactor chamber, and a fourth reactor chamber;

a wafer handling chamber that is provided so as to be closer to the first reactor chamber and the second reactor chamber than the third reactor chamber and the fourth reactor chamber, and that intercommunicates with the first reactor chamber and the second reactor chamber; and a back-end robot that is provided in the wafer handling chamber and is configured to transfer a substrate, wherein the susceptor and the plurality of susceptor pins are provided in the first reactor chamber, the second reactor chamber, the third reactor chamber, and the fourth reactor chamber, and the plurality of sensors and the control device are provided in the third reactor chamber and the fourth reactor chamber.

6. The substrate processing apparatus according to claim 5, wherein the transfer arm is a rotation arm configured to move a substrate placed in one of the first reactor chamber, the second reactor chamber, the third reactor chamber, and the fourth reactor chamber to another chamber.

7. The substrate processing apparatus according to claim 5, comprising an automatic wafer sensing unit configured to determine whether a substrate has passed a predetermined position when the substrate is transferred from the wafer handling chamber to the first reactor chamber or the second reactor chamber by the back-end robot.

8. A substrate transfer method comprising:

positioning a substrate supported by a transfer arm above a susceptor;

when the substrate is brought into contact or separated from a plurality of three or more susceptor pins, checking that an order of variations in a contact state of the substrate with the plurality of susceptor pins is a predetermined order, and that a time difference between the variations in the contact state of the substrate with the plurality of susceptor pins is within a predetermined time difference range; and performing at least one of stopping the transfer arm, reporting to a user, and changing a transfer method using the transfer arm when the order of the variations in the contact state is not the predetermined order or the time difference between the variations in the contact state is not within the predetermined time difference range.

9. The substrate transfer method according to claim 8, wherein the checking is performed when the transfer arm supporting the substrate is brought close to the susceptor to bring the substrate into contact with the plurality of susceptor pins.

10. The substrate transfer method according to claim 8, wherein the checking is performed when the susceptor is moved upward with respect to the plurality of susceptor pins to bring the susceptor into contact with the substrate while the substrate is supported by the plurality of susceptor pins, thereby separating the substrate from the plurality of susceptor pins.

11. The substrate transfer method according to claim 8, wherein the checking is performed when the susceptor is moved downward with respect to the plurality of susceptor pins to bring the substrate into contact with the plurality of susceptor pins while the substrate is supported by the susceptor.

* * * * *